United States Patent
Lipkin et al.

(10) Patent No.: US 6,246,076 B1
(45) Date of Patent: Jun. 12, 2001

(54) LAYERED DIELECTRIC ON SILICON CARBIDE SEMICONDUCTOR STRUCTURES

(75) Inventors: Lori A. Lipkin; John Williams Palmour, both of Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/141,795

(22) Filed: Aug. 28, 1998

(51) Int. Cl.[7] .................. H01L 31/0312; H01L 29/76; H01L 23/58; H01L 29/00
(52) U.S. Cl. .................. 257/77; 257/410; 257/411; 257/640; 257/641; 257/649; 257/506
(58) Field of Search .................. 257/77, 410, 411, 257/640, 641, 649, 506; 427/95; 438/287; 385/89

(56) References Cited

U.S. PATENT DOCUMENTS

| | | | |
|---|---|---|---|
| 3,924,024 | * 12/1975 | Naber et al. | 427/95 |
| 4,466,172 | 8/1984 | Batra | 438/287 |
| 4,875,083 | 10/1989 | Palmour | 257/77 |
| 5,170,455 | 12/1992 | Goossen et al. | 385/89 |
| 5,184,199 | 2/1993 | Fujii et al. | 257/77 |
| 5,510,630 | * 4/1996 | Agarwal et al. | 257/77 |
| 5,763,905 | 6/1998 | Harris | 257/77 |
| 6,025,608 | * 2/2000 | Harris et al. | 257/77 |

FOREIGN PATENT DOCUMENTS

| | | |
|---|---|---|
| 0637069 | 2/1995 | (EP) . |
| WO 97/17730 | 5/1997 | (WO) . |
| WO 97/39485 | 10/1997 | (WO) . |
| WO 98/02924 | 1/1998 | (WO) . |

OTHER PUBLICATIONS

Ma et al., "Fixed and trapped charges at oxide–nitride–oxide heterostructure interfaces formed by remote plasma enchanced chemical vapor deposition," J. Vac.Sci. Technol. B. 11(4), Jul./Aug. 1993, pp. 1533–1540.

Kobayashi et al., "Dielectric Breakdown and Current Conduction of Oxide/Nitride/Oxide Multi–Layer Structures," 1990 Symposium on VLSI Technology, IEEE, pp. 119–120.

Lipkin et al., Insulator Investigation on SiC for Improved Reliability; IEEE Transactions on Electron Devices, Mar. 1999, pp. 525–532; vol. 46, No. 3.

Agarwal et al., Temperature Dependence of Fowler–Nordheim Current in 6H– and 4H–SiC MOS Capacitors; IEEE Electron Device Letters, Dec. 1997, pp. 592–594; vol. 18, No. 12.

Agarwal et al., A Critical Look at the Performance Advantages and Limitations of 4H–SiC Power UMOSFET Structures; Proceedings of the International Symposium on Power Semiconductor Devices and IC's, 1996, pp. 119–122.

* cited by examiner

Primary Examiner—Steven Loke
(74) Attorney, Agent, or Firm—Philip Summa, P.A.

(57) ABSTRACT

A dielectric structure is disclosed for silicon carbide-based semiconductor devices. In gated devices, the structure includes a layer of silicon carbide, a layer of silicon dioxide on the silicon carbide layer, a layer of another insulating material on the silicon dioxide layer, with the insulating material having a dielectric constant higher than the dielectric constant of silicon dioxide, and a gate contact to the insulating material. In other devices the dielectric structure forms an enhanced passivation layer or field insulator.

20 Claims, 6 Drawing Sheets

LAYERED DIELECTRIC ON SILICON CARBIDE SEMICONDUCTOR STRUCTURES

FIELD OF THE INVENTION

The present invention relates to high power, high field, or high temperature silicon carbide devices and in particular relates to insulated gate field effect transistors, device passivation, and field insulation. This invention was developed under Army Research Laboratories contract number DAAL01-98-C-0018. The government may have certain rights in this invention.

BACKGROUND OF THE INVENTION

The present invention relates to silicon carbide devices particularly insulated gate devices and devices that incorporate device passivation, edge termination, or field insulation, and that are formed in silicon carbide because of silicon carbide's advantageous physical and electronic characteristics.

For electronic devices, particularly power devices, silicon carbide offers a number of physical, chemical and electronic advantages. Physically, the material is very hard and has an extremely high melting point, giving it robust physical characteristics. Chemically, silicon carbide is highly resistant to chemical attack and thus offers chemical stability as well as thermal stability. Perhaps most importantly, however, silicon carbide has excellent electronic properties, including high breakdown field, a relatively wide band gap (about 2.9 eV at room temperature for the 6H polytype), high saturated electron drift velocity, giving it significant advantages with respect to high power operation, high temperature operation, radiation hardness, and absorption and emission of high energy photons in the blue, violet, and ultraviolet regions of the spectrum.

Accordingly, interest in silicon carbide devices has increased rapidly and power devices are one particular area of interest. As used herein, a "power" device is one that is designed and intended for power switching and control or for handling high voltages and large currents, or both. Although terms such as "high field" and "high temperature" are relative in nature and often used in somewhat arbitrary fashion, "high field" devices are generally intended to operate in fields of 1 or more megavolts per centimeter, and "high temperature" devices generally refer to those operable above the operating temperatures of silicon devices; i.e., at least 200° C. and preferably 250–400° C., or even higher. For power devices, the main concerns include the absolute values of power that the device can (or must) handle, and the limitations on the device's operation that are imposed by the characteristics and reliability of the materials used.

Silicon carbide-based insulated gate devices, particularly oxide-gated devices such as MOSFETs, must, of course, include an insulating material in order to operate as IGFETs. Similarly, MIS capacitors require insulators. By incorporating the insulating material, however, some of the physical and operating characteristics of the device become limited by the characteristics of the insulator rather than by those of silicon carbide. In particular, in silicon carbide MOSFETs and related devices, silicon dioxide ($SiO_2$) provides an excellent insulator with a wide band gap and a favorable interface between the oxide and the silicon carbide semiconductor material. Thus, silicon dioxide is favored as the insulating material in a silicon carbide IGFET. Nevertheless, at high temperatures or high fields or both, at which the silicon carbide could otherwise operate satisfactorily, the silicon dioxide tends to electrically break down; i.e., to develop defects, including traps that can create a current path from the gate metal to the silicon carbide. Stated differently, silicon dioxide becomes unreliable under the application of high electric fields or high temperatures (250–400° C.) that are applied for relatively long time periods; i.e., years and years. It will be understood, of course, that a reliable semiconductor device should have a statistical probability of operating successfully for tens of thousands of hours.

Additionally, those familiar with the characteristics of semiconductors and the operation of semiconductor devices will recognize that passivation also represents a challenge for structures other than insulated gates. For example, junctions in devices such as mesa and planar diodes (or the Schottky contact in a metal-semiconductor FET) produce high fields that are typically passivated by an oxide layer, even if otherwise non-gated. Such an oxide layer can suffer all of the disadvantages noted above under high field or high temperature operation.

Accordingly, IGFET devices formed in silicon carbide using silicon dioxide as the insulator tend to fall short of the theoretical capacity of the silicon carbide because of the leakage and the potential electrical breakdown of the silicon dioxide portions of the device.

Although other candidate materials are available for the insulator portion of silicon carbide IGFETs, they tend to have their own disadvantages. For example, high dielectrics such as barium strontium titanate or titanium dioxide have dielectric constants that drop dramatically when a field is applied. Other materials have poor quality crystal interfaces with silicon carbide and thus create as many problems (e.g., traps and leakage current) as might solved by their high dielectric constant. Others such as tantalum pentoxide ($Ta_2O_5$) and titanium dioxide ($TiO_2$) tend to exhibit an undesired amount of leakage current at higher temperatures. Thus, simply substituting other dielectrics for silicon dioxide presents an entirely new range of problems and disadvantages in their own right.

Recent attempts to address the problem have included the techniques described in U.S. Pat. No. 5,763,905 to Harris, "Semiconductor Device Having a Passivation Layer." Harris '905 appears to be somewhat predictive, however, and fails to report any device results based on the disclosed structures.

Therefore, the need exists for a dielectric composition or structure that can reliably withstand high electric fields while minimizing or eliminating current leakage, and while operating at high temperatures in order to take full advantage of silicon carbide's electrical characteristics.

OBJECT AND SUMMARY OF THE INVENTION

Therefore, it is an object of the present invention to provide dielectric structures for silicon carbide-based IGFETs that can take advantage of the power handling capabilities of silicon carbide.

The invention meets this object with a dielectric structure for silicon carbide devices that comprises a layer (or device) of silicon carbide, a layer of silicon dioxide on the silicon carbide layer, a layer of another insulating material on the silicon dioxide layer, with the insulating material having a dielectric constant higher than the dielectric constant of silicon dioxide, and a gate contact (for gated devices) to the insulating material. In preferred embodiments the dielectric structure includes a capping layer of $SiO_2$ between the high dielectric and the gate.

In another aspect, the invention provides insulated gate devices such as MISFETs that incorporate the inventive dielectric structure as the gate insulator.

In another aspect, the invention provides passivation, edge termination, or field insulation for silicon carbide devices.

In another aspect, the invention provides a high power semiconductor device for which the active portions are formed of silicon carbide, and that include passivation portions that experience high fields under an applied potential. These passivation portions are in turn formed of a layer of silicon dioxide on a portion of the silicon carbide, a layer of another insulating material on the silicon dioxide that has a dielectric constant higher than the dielectric constant of silicon dioxide, and a capping layer of silicon dioxide on the high dielectric layer.

The foregoing and other objects and advantages of the invention and the manner in which the same are accomplished will become clearer based on the following detailed description taken in conjunction with the accompanying drawings in which:

DETAILED DESCRIPTION

Figure 1:
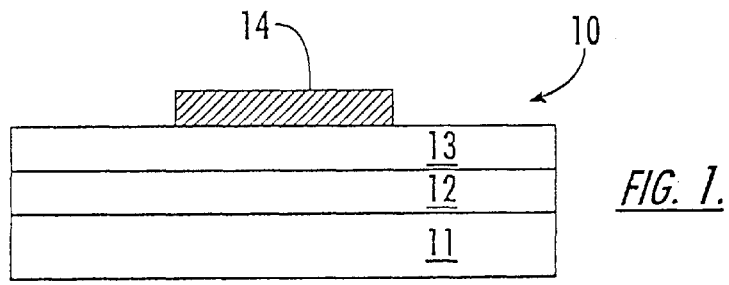
FIG. 1 is a cross-sectional view of a first embodiment of the present invention.

The present invention is a dielectric structure for wide bandgap semiconductor materials and related devices formed from such materials. A device structure according to the present invention, in particular a basic MIS capacitor, is illustrated in FIG. 1 and is broadly designated at 10. The structure comprises a layer of silicon carbide 11 which can be a substrate portion or an epitaxial layer of silicon carbide. The manufacture of such single crystal silicon carbide substrates and the various epitaxial layers can be carried out according to various techniques described in U.S. patents that are commonly assigned (or licensed) with the present invention. These include but are not necessarily limited to Nos. Re. 34,861; 4,912,063; 4,912,064; 4,946,547; 4,981,551; and 5,087,576, the contents of all of which are incorporated entirely herein by reference. The substrate or epitaxial layer can be selected from among the 3C, 4H, 6H, and 15R polytypes of silicon carbide with the 4H polytype being generally preferred for high power devices. In particular, the higher electron mobility of the 4H polytype makes it attractive for vertical-geometry devices. The device structure 10 next includes a layer of silicon dioxide 12 on the silicon carbide layer. Silicon dioxide has an extremely wide bandgap (about 9 eV at room temperature) and forms an excellent physical and electronic interface with silicon carbide. Thus, it is a preferred insulator for many purposes with the exception that, as noted in the Field and Background, it can exhibit characteristic weaknesses at high temperatures under high fields.

Accordingly, the invention further includes a layer 13 of another insulating material on the silicon dioxide layer 12. The layer 13 is selected as having a dielectric constant ($\epsilon$) higher than the dielectric constant of silicon dioxide, and also has physical and chemical characteristics that enable it to withstand the high temperature operation for which the silicon carbide portion of the device is intended. In preferred embodiments, the high dielectric material is selected from (but not limited to) the group consisting of silicon nitride, barium strontium titanate (($Ba,Sr)TiO_3$), titanium dioxide ($TiO_2$), tantalum pentoxide ($Ta_2O_5$), aluminum nitride (AlN), and oxidized aluminum nitride, with silicon nitride and oxidized aluminum nitride being particularly preferred, and with silicon nitride ($Si_3N_4$) being most preferred. The gate contact 14 is made to the insulating material layer 13 for permitting a bias to be applied to the device structure.

Figure 2:
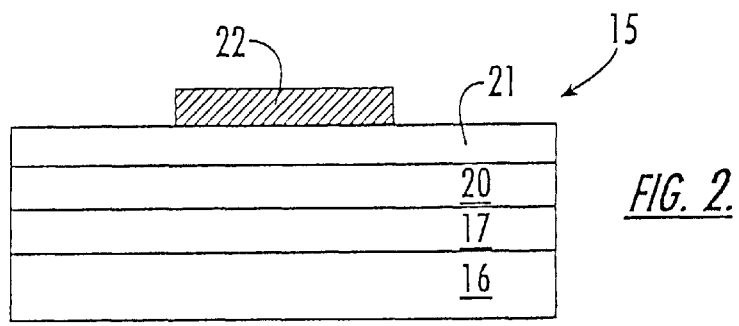
FIG. 2 is a similar view of a second embodiment of the invention.

FIG. 2 illustrates a second embodiment of the device (also a MIS capacitor) broadly designated at 15. As in FIG. 1, the second embodiment includes a silicon carbide layer 16 (epitaxial or substrate), the first silicon dioxide layer 17, the insulating material 20 selected according to the criteria noted above, and a second layer of silicon dioxide 21 between the gate contact 22 and the insulating layer 20. The second silicon dioxide layer 21 provides a barrier to prevent charge from passing between the gate metal and the high dielectric material.

In preferred embodiments, the silicon dioxide layers 12 or 17 are thermally formed following which the insulating layers 13 or 20 are deposited by chemical vapor deposition (CVD). The insulating layers can, however, be formed by any appropriate technique, e.g., certain oxides can be formed by sputter-depositing a metal and then oxidizing it. As another example, $Si_3N_4$ can be deposited by plasma-enhanced CVD (PECVD). Because the $SiO_2$ layer 12 or 17 serves to prevent tunneling, it does not need to be exceptionally thick. Instead, the $SiO_2$ layer is preferably maintained rather thin so that the extent of thermal oxidation can be limited. As recognized by those familiar with these materials, implantation can affect the manner in which SiC oxidizes. Thus, if extensive oxidation is carried out on a device or precursor having implanted SiC portions, the resulting oxidized portions will differ in thickness from one another, a characteristic that can be disadvantageous in certain circumstances. Accordingly, limiting the extent of oxidation helps minimize or eliminate such problems. Alternatively, the oxide can be deposited (e.g., by CVD) to avoid the problem altogether.

In preferred embodiments, the first silicon dioxide layer 17 or 12 is no more than about 100 angstroms thick while the layer of insulating material (13 or 20) can be about 500 angstroms thick. Stated differently, each of the oxide layers represents between about 0.5 and 33 percent of the total thickness of the passivation structure, with the insulating material making up the remainder. In preferred embodiments, the oxide layers are each about 20 percent of the total thickness and the preferred nitride insulator is about 60 percent of the total thickness.

Figure 3:
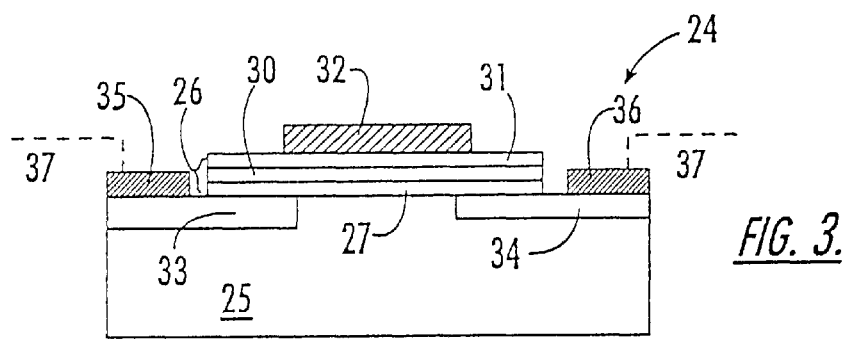
FIG. 3 is a cross-sectional view of an IGFET according to the present invention.
Figure 4:
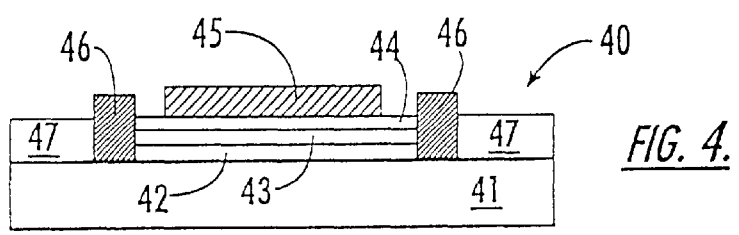
FIG. 4 is a cross-sectional view of an MIS capacitor according to the present invention.

FIGS. 3 and 4 illustrate a respective IGFET and MIS capacitor according to the present invention. FIG. 3 shows an IGFET broadly designated at 24 with a first silicon carbide portion 25 having a first conductivity type. A gate insulator structure according to the present invention is on the first silicon carbide portion 25 and is designated by the brackets 26. Taken individually, the gate insulator includes the layer of silicon dioxide 27 and the layer of an insulating material 30 that has the dielectric constant higher than the dielectric constant of silicon carbide. In the embodiment illustrated is FIG. 3, the insulator 26 further includes the second layer 31 of silicon dioxide. The IGFET of FIG. 3 further includes a gate contact 32 and respective second and third portions of silicon carbide 33 and 34 that have the opposite conductivity type from the first silicon carbide portion 25. Respective ohmic contacts 35 and 36 are made to the portions 33 and 34 to form the source and drain portions of the FET. As indicated by the dotted lines in FIG. 3, devices such as the IGFET 24 can be segregated from one another using a field oxide 37. Those familiar with such devices and with integrated circuits made from them will recognize that the field oxide portions 37 serve to segregate the device from other devices. Although the field oxide is not directly electronically related to the gate insulator portion 26, the insulator structure of the present invention can provide similar advantages as a field insulator.

FIG. 4 illustrates an MIS capacitor according to the present invention and in particular a variable capacitance device analogous to that set forth in U.S. Pat. No. 4,875,083, the contents of which are incorporated herein by reference. The capacitor in FIG. 4 is broadly designated at 40 and comprises a doped silicon carbide portion 41 and a capacitance insulator portion on the dope silicon carbide portion. The capacitance insulator portion includes a layer of silicon dioxide 42 on the silicon carbide portion, a layer 43 of the other insulating material with the dielectric constant higher than the dielectric constant of silicon dioxide. In the embodiment illustrated in FIG. 4, the capacitor 40 also includes the second layer 44 of silicon dioxide between the other insulating material layer 43 and the gate contact that is illustrated at 45. The contact 45 can be made of metal or an appropriate conductive semiconductor such as polysilicon that is sufficiently doped to give the required contact characteristics. An ohmic contact 46 which in the illustrated embodiment forms a ring, two sections of which are shown in the cross-sectional view of FIG. 4, is made to the doped silicon carbide portion 41 so that a bias applied to the metal contact 45 variably depletes the doped silicon carbide portion 41 to correspondingly vary the capacitance of the capacitor 40. As in the embodiment in FIG. 3, field oxide portions 47 can also be typically included to segregate the device from its neighbors. As noted above, the portions 47 can also incorporate the dielectric structure of the present invention.

Those familiar with semiconductor devices will understand that the illustrations of FIGS. 1–4 and 6 are exemplary, rather than limiting, in their representations of various insulated gate and metal-insulator-semiconductor structures. Thus, although FIGS. 1–4 and 6 show generally planar structures and devices, it will be understood that the insulator structures of the present invention can be applied to a wider variety of device geometries, for example UMISFETs. Other gated structures for which the dielectric structure of the invention is useful include MISFETs, insulated gate bipolar transistors (IGBTs), MOS-turn off thyristors (MTOs), MOS-controlled thyristors (MCTs) and accumulation FETs (ACCUFETs). Non-gated structures for which the invention can provide enhanced passivation, edge termination, or field insulation include p-i-n diodes, Schottky rectifiers, and metal-semiconductor field-effect transistors (MESFETs).

The invention also provides the same advantages for particular structures including lateral power MOSFETs and double diffused MOSFETs (DMOSFETs), which are vertically oriented devices (i.e., with source and drain on opposite surfaces of the substrate). Exemplary devices are described in U.S. Pat. Nos. 5,506,421 and 5,726,463; the contents of both of which are incorporated entirely herein by reference. Additional exemplary devices are set forth in co-pending U.S. applications Ser. No. 08/631,926 filed Apr. 15, 1996 ("Silicon Carbide CMOS and Method of Fabrication"); Ser. No. 09/093,207 filed Jun. 8, 1998 ("Self-Aligned Methods of Fabricating Silicon Carbide Power Devices by Implantation and Lateral Diffusion"); and Ser. No. 09/093,208 filed Jun. 8, 1998 ("Methods of Forming Silicon Carbide Power Devices by Controlled Annealing"); and the contents of these applications are likewise incorporated entirely herein by reference.

Figure 8:
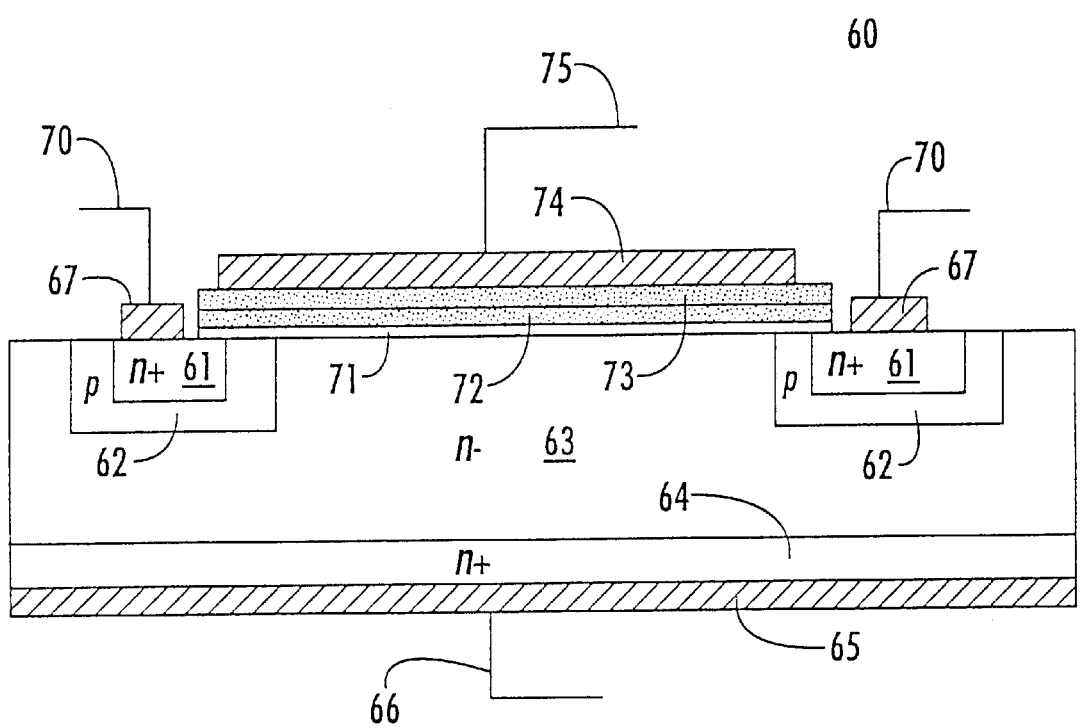
FIG. 8 is a cross-sectional view of a MOSFET according to the present invention.

FIG. 8 illustrates a double-diffused or double-implanted MOSFET broadly designated at 60 that incorporates the insulator structure of the present invention. As illustrated in FIG. 8, the transistor source is formed by n+ regions 61 within p-type wells 62 which are incorporated into a silicon carbide portion shown as the epitaxial layer 63 in the manner described in the above-referenced applications. The region 63 represents the drain drift region of the transistor with the n+ drain being illustrated at 64, a drain contact at 65, and an appropriate wire lead at 66. Similarly, the source contacts are respectively shown at 67 with their wire leads 70. The gate insulator structure is formed according to the present invention and in preferred embodiments includes the first silicon dioxide layer 71, a silicon nitride layer 72, and a second silicon dioxide layer 73. A gate metal contact 74 and its wire lead 75 complete the structure. In operation, the p-type regions 62 are depleted to form an inversion layer when a bias is applied to the gate contact 74. Those familiar with these devices will also recognize that if the drain portion 64 were to be changed in this structure from n+ conductivity to p-type conductivity, the resulting illustration would represent an insulated gate bipolar transistor (IGBT).

The illustrated structures improve the gate or field passivation by layering the second dielectric material over the silicon dioxide. The silicon dioxide continues to provide a large electrical barrier (i.e., its 9 eV bandgap) on silicon carbide and prevents the layered dielectric from leaking current. In complementary fashion, the additional dielectric material (with its higher dielectric constant) improves the high temperature and high field reliability as compared to a single dielectric layer. Thus, the layered dielectric combines the functional strengths of the two different materials to form a better dielectric on silicon carbide than could be attained with a single material. Additionally, silicon dioxide forms a better interface, in terms of electrically charged or active states, with silicon carbide than does any other dielectric material.

The dielectric constant of the material selected to be layered with the silicon dioxide is an important consideration because the field in the dielectric will be directly related to the field in the nearby silicon carbide and further related to the ratio of the dielectric constants of the layered dielectric and the silicon carbide. Table 1 summarizes the dielectric constant for some common semiconductor devices and also lists silicon carbide as the figure of merit.

TABLE 1

| Material | Dielectric Constant | Critical Field (MV/cm) | Operating Field (MV/cm) | $\epsilon E_0$ (MV/cm) |
|---|---|---|---|---|
| SiC | 10 | 3 | 3 | 30 |
| Thermal SiO$_2$ | 3.9 | 11 | 2 | 7.8 |
| Deposited SiO$_2$ | 3.9 | 11 | 2 | 7.8 |
| Si$_3$N$_4$ | 7.5 | 11 | 2 | 15 |
| ONO | 6 | 11 | ~2 | ~12 |
| AlN | 8.4 | 10–12 | ~3‡ | ~30 |
| AlO:N | 12.4[1] | 8‡ | ~1‡ | ~12 |
| Si$_x$N$_y$O$_z$ | 4–7 | 11 | ~2 | ~8–14 |
| (Ba,Sr)TiO$_3$ | 75–250* | 2‡ | ~0.1[2] | ~8 |
| TiO$_2$ | 30–40 | 6 | ~0.2‡ | ~4 |
| Ta$_2$O$_5$ | 25 | 10[3] | ~0.3[3] | ~7.5 |

*The dielectric constant of (Ba,Sr)TiO$_3$ drops dramatically with applied field.
‡Estimated.

In Table 1, the Critical Field represents the field strength at which the material will break down immediately. The Operating Field (E$_o$) is the highest field that is expected to cause little or no degradation to the dielectric for a satisfactory time period, e.g., at least 10 years.

The invention improves the reliability of the gate or field passivation on silicon carbide by utilizing a dielectric material with a higher dielectric constant than silicon dioxide. In this regard, Gauss' Law requires the field in the dielectric to be the field in the semiconductor multiplied by a factor of ($\epsilon_{semiconductor}/\epsilon_{dielectric}$). Accordingly, materials with dielectric constants higher than the dielectric constant of silicon carbide will have a lower electric field than the nearby silicon carbide. Accordingly, a critical measure of a material's applicability as a gate dielectric or passivating material for power devices is the product of field strength (E) and dielectric constant ($\epsilon$). Ideally the product of $\epsilon E$ would exceed that of silicon carbide.

In this regard, Table 1 lists several dielectrics that could be potentially layered with silicon dioxide to create an insulator structure that has better electrical characteristics than either of the two materials alone. Nevertheless, additional materials may be used in a dielectric structure and the selection is not limited to those in Table 1.

The layered dielectric of the invention has four important characteristics that enable silicon carbide MIS devices to operate at high temperatures or at high gate voltages: First, the bulk of the dielectric can be deposited, thus avoiding thermal consumption of SiC. As noted earlier, thermally grown silicon dioxide tends to consume silicon carbide more rapidly over implanted regions thus resulting in a physical step and higher fields at the edge of an implanted region. Second, the SiO$_2$ portion of the insulator structure has a high quality interface with silicon carbide. Third, the multilayer structure minimizes leakage currents at high temperatures (250–400° C.). Fourth, the non-SiO$_2$ portion contributes a relatively high dielectric constant thus lowering the field in the on-SiO$_2$ dielectric as dictated by Gauss' Law.

In producing a particular structure, the physical thickness of the layered dielectric of the invention generally will be different than that of a single dielectric layer, with the difference being determined by the ratios of the dielectric constants. Additionally, to date, the layered dielectric is most preferably structured with silicon dioxide as the bottom layer (i.e., the one in contact with the silicon carbide), because this is required for acceptable leakage currents at high temperatures.

MIS CAPACITORS

Capacitors were fabricated using the materials in Table 2 and including those of the present invention. In a preferred embodiment, a three-step process was used to produce respective silicon dioxide, silicon nitride, and silicon dioxide layers. First, high quality silicon dioxide was thermally grown on silicon carbide in an oxidation furnace to a thickness of about 100 angstroms (Å). A preferred oxidation technique is set forth in co-pending and commonly assigned application Ser. No. 08/554,319, filed Nov. 8, 1995, for "Process for Reducing Defects in Oxide Layers on Silicon Carbide," the contents of which are incorporated entirely herein by reference. Next a 500 Å nitride layer was deposited using low pressure chemical vapor deposition (LPCVD) with silane (SiH$_4$) and ammonia (NH$_3$) as the source gases. This nitride layer was then oxidized in a wet ambient atmosphere at 950° C. for three hours to form a second layer of silicon dioxide that was between about 50 and 100 angstroms thick.

DC leakage currents were measured on these MIS capacitors over a range of ±15 volts. Such a voltage corresponds to a field of approximately 3 megavolts per centimeter. Table 2 summarizes the leakage currents in microamps per square centimeter ($\mu$A/cm$^2$) measured on different MIS capacitors. Capacitors that have minimal leakage at room temperature were then measured at 250° C. The leakage at this temperature is identified in the Table as the "HT leak." A dash indicates no measurable leakage (less than 500 picoamps), while "too high" indicates insulators whose room temperature leakage was so high that no 250° C. measurement was performed.

TABLE 2

| | | 6HP | 6HN | 4HN |
|---|---|---|---|---|
| Thermal SiO$_2$ | Leak= | — | — | — |
| | HT Leak= | — | — | — |
| LPCVD SiO$_2$ | Leak= | — | — | — |
| | HT Leak= | — | — | — |
| Silicon Nitride | Leak= | — | — | — |
| | HT Leak= | 56 | 1 | 1 |
| ONO | Leak= | — | — | — |
| | HT Leak= | — | — | — |
| AlN | Leak= | 125 | 250,000 | >1000000 |
| | HT Leak= | too high | too high | too high |
| AlO:N | Leak= | — | — | — |
| | HT Leak= | 2 | >1E6 | >1E6 |

As Table 2 demonstrates several dielectrics do not insulate well on silicon carbide with some, such as aluminum nitride, lacking satisfactory characteristics even at room temperature. Only the structures that included silicon dioxide insulated well on silicon carbide at 250° C. This is most likely related to the bandgap of the dielectric material and the resulting low band offsets (barrier heights) with silicon carbide. Silicon carbide has a bandgap of about 3 eV and for a material to insulate, a barrier height of at least about 2 eV is desired. Thus, on silicon carbide, the dielectric material or structure should have a bandgap of at least about 7 eV. Standing alone, silicon nitride, with a bandgap of 6 eV was thus expected to—and did—demonstrate problems, as shown by the leakage current measurements reported in Table 2. The bandgap of aluminum nitride (6.2 eV) is not very different than that of silicon nitride, and aluminum nitride has substantially higher leakage currents. The leakage currents demonstrated by the aluminum nitride and the silicon nitride prevent these materials from being useful as sole gate dielectrics. Additionally, further analysis of these insulators was limited to evaluating the net oxide charge.

Although a dielectric must have high reliability for high temperature high field device passivation applications, such reliability represents a necessary, but not a sufficient characteristic, to make it applicable for the gate layer of an MIS device. For such applications, charged bulk defects and electrically active interface defects must be minimized. Charged bulk defects will tend to cause voltage shifts in the device, while electrically active interface defects will degrade the channel mobility.

Charged bulk defects are traditionally referred to as "fixed oxide charge" and are measured by the flatband voltage determined by a room temperature high frequency capacitance-voltage (CV) curve. Any difference between the actual voltage at which flatband capacitance occurs and the ideal value, accounting for metal-semiconductor work functions, is attributed to this fixed oxide charge. For wide bandgap semiconductors such as silicon carbide, however, the term "fixed" oxide charge is a misnomer. This calculated charge density includes contributions from interface states, many of which appear fixed at room temperature. For this reason, this calculated charge density is referred to herein as a "net" oxide charge.

Electrically active defects at the dielectric-semiconductor interface are termed interface states. These states can severely degrade the channel mobility of an MIS devices by either trapping and releasing the electrons, or by providing a charged site which would apply a force normal to the current flow. Either of these effects will inhibit current flow and subsequently reduce the channel mobility.

Accordingly, Table 3 compares the net oxide charge densities and minimum measured interface state densities of the various capacitors.

TABLE 3

| Insulator | 6H P-type | 6H N-type | 4H N-type |
|---|---|---|---|
| Net Oxide Charge ($10^{11}$ cm$^{-2}$) | | | |
| Thermal SiO$_2$ | 6.9 | −10.8 | −26 |
| LPCVD SiO$_2$ | 7.5 | −11.5 | −29 |
| Silicon Nitride | Leaky | −9.7 | −51 |
| ONO | 130 | 1.9 | 5.9 |
| AlN | 64 | −26 | −54 |
| AlO:N | 8.9 | 1.3 | −5.2 |
| Interface State Densities ($10^{10}$ cm$^{-2}$ eV$^{-1}$) | | | |
| Thermal SiO$_2$ | 6.2 | 36 | 210 |
| LPCVD SiO$_2$ | 7.5 | 18 | 270 |
| Silicon Nitride | Leaks | 240 | 1500 |
| ONO | 74 | 5.7 | 14 |
| AlN | 650 | leaks | leaks |
| AlO:N | 50 | leaks | leaks |

The not oxide charge and interface state densities are the lowest on the thermal oxides and the LPCVD oxides, with no significant differences seen between these samples. For the n-type samples, the net oxide charge and interface state densities are significantly lower on the silicon dioxide/silicon nitride/silicon dioxide sample (also referred to herein as "ONO" structures). The silicon carbide/insulator interface quality is obviously superior when silicon dioxide forms the interface with the silicon carbide.

As shown in Table 4, the silicon dioxide layers had the highest breakdown fields, especially at high temperature, regardless of the manner in which they were grown or deposited. The 1100° C. thermally grown oxides had the highest breakdown fields, with the deposited oxides being almost as high.

Although the breakdown field is important, the dielectric must also be considered. Table 4 lists breakdown fields ($E_B$) averaged across the three wafer types (where possible) and then multiplied by the empirical dielectric constant ($\epsilon$) for both room temperature and 350° C. measurements. The highest products of $E_B\epsilon$ were measured on the ONO, the thermally grown oxide, the deposited oxide, and the aluminum oxy nitride.

TABLE 4

| Maximum Breakdown Field (MV/cm) | | | |
|---|---|---|---|
| 6H P | 6H N | 4H N | $\in \times (E_{BD})$ |
| Room Temperature | | | |
| 8.0 | 7.0 | 8.7 | 31 |
| 12.8 | 10.6 | 9.9 | 43 |
| 11.8 | 9.9 | 10.0 | 41 |
| 7.4 | 5.2 | 5.8 | 46 |
| 9.0 | 8.0 | 8.4 | 51 |
| 1 | 0.5 | 1 | 7 |
| 8.6 | 4.0 | 4.8 | 38 |
| 350° C. | | | |
| 8.0 | 7.6 | 8.0 | 31 |
| 10.6 | 7.8 | 7.5 | 34 |
| 7.2 | 8.6 | 5.9 | 28 |
| 3.0 | 3.9 | 3.2 | 25 |
| 5.9 | 6.1 | 5.9 | 36 |
| — | — | — | Leaks |
| 5 | — | — | 33 |

Figure 7:
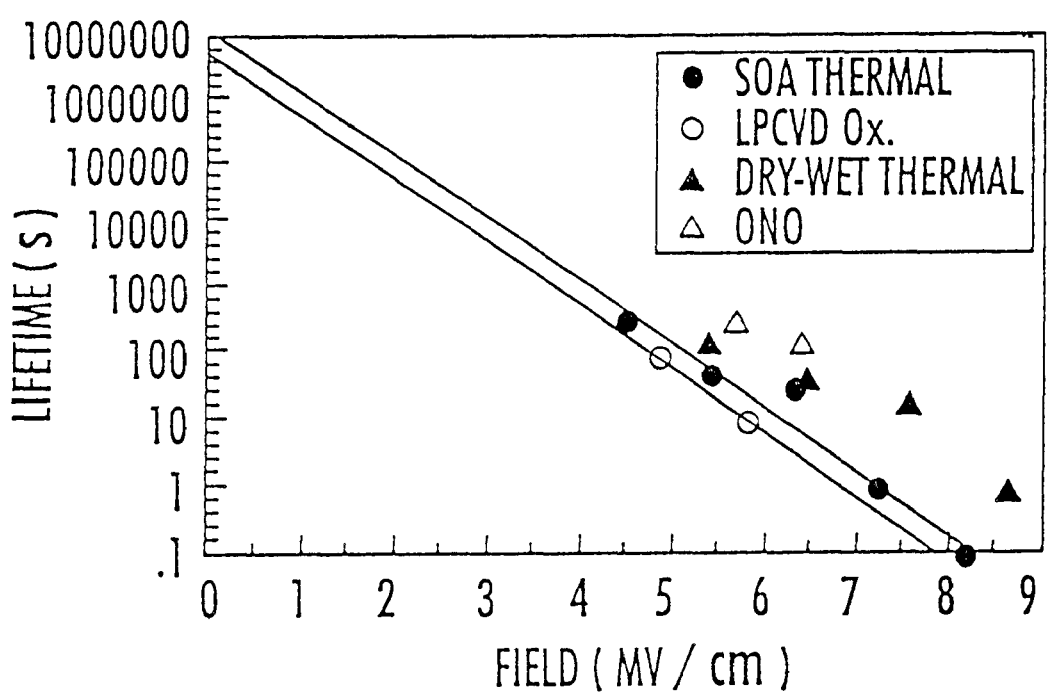
FIG. 7 is a comparative plot of device lifetimes versus electric field.

Time-bias measurements at 350° C. taken on 6H n-type SIC MIS capacitors are shown in FIG. 7. Here the measured points are shown by the symbols, and the exponential least squares fit is shown by the lines. The lifetimes exhibited by these devices are low, which is partially due to the small sample size. However, these values are not atypical for oxides on n-type SiC at 350° C.

The ONO capacitors had the highest lifetimes, showing more than an order of magnitude improvement in lifetime over both the deposited and thermal oxides at a given applied electric field. Although the p-type interface quality of ONO capacitors is not as good as the thermal or deposited oxides, the n-type interface quality is better than any of the other materials.

MISFETs

In addition to the capacitors, several planar metal-insulator semiconductor field effect transistors (MISFETs) were fabricated with thermal oxides and with the layered ONO dielectrics. An additional comparison of the robustness of the MOSFETs was made by comparing a breakdown voltages of the different dielectric materials. The field strength of the dielectrics were measured at both room temperature and 350° C., and the results are set forth in Table 5.

TABLE 5

| Insulator | RT BD Voltage (V) | RT BD (MV/cm) | 350° C. BD Voltage (V) | 350° C. BD (MV/cm) |
|---|---|---|---|---|
| Thermal SiO$_2$ | 35 | 7 | 25 | 5 |
| LPCVD SiO$_2$ | 45 | 9 | 35 | 7 |
| ONO | 80‡ | 11.4‡ | 45‡ | 6.4‡ |

‡The dielectric did not actually breakdown at this voltage, but leaked.

As noted earlier, thermal oxidation results in a physical step, as the implanted source and drain regions oxidize faster than the non-implanted channel region. Thermal oxides grown on implanted areas also tend to be weaker than those grown on non-implanted material. These two effects are combined in a thermally oxidized MOSFET, where the step enhances the field and the region of the weakest oxide. Thus the breakdown field of the thermally oxidized MOSFET is significantly reduced from the breakdown fields demonstrated by the MOS capacitors.

The deposited oxide has a higher breakdown field than the thermally grown oxide, but the highest breakdown voltage was achieved with the ONO dielectric layers. The field was slightly low at 350° C., but the breakdown voltage is probably a better indicator of device reliability because a silicon nitride gate insulator must be thicker in order to have the same gate capacitance. Thus the ONO structure demonstrated almost double the high temperature breakdown voltage of the thermally oxidized devices.

Figure 5:
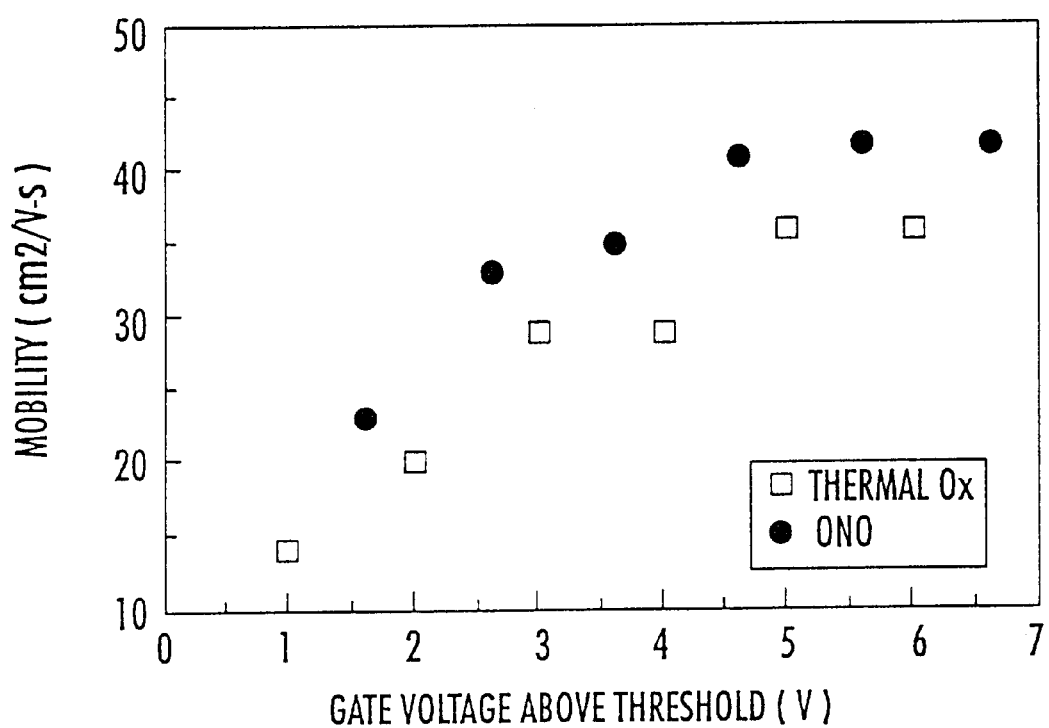
FIG. 5 is a comparison plot of electron mobility versus gate voltage for conventional thermal oxides and insulators according to the present invention.

The channel mobility of the fat FETs (a "fat" FET has a gate width approximately equal to its gate length) was determined from the linear regime of the MISFET: The drain voltage was set a 0.25 volts, and the gate voltages stepped from 0 to 10 volts in one volt steps. The mobility was calculated from the conductance between the various gate voltages, which is independent of the threshold voltage. FIG. 5 compares the channel mobility of the MISFETs fabricated with layered ONO dielectrics to those with thermal oxides. The ONO MISFETs have a slightly higher mobility. FIG. 5 thus shows that the ONO layered dielectric structure is at least as good as a thermal oxide in these devices.

An estimate of the MISFET device reliability at high temperatures was measured by applying a gate voltage of 15V (3 MV/cm) to a 4×100 $\mu$m gate, grounding the source, drain and substrate, and monitoring the gate current until a compliance current of 1 nA was reached. This compliance current corresponds to a current density of 0.25 mA/cm$^2$. The gate voltage was increased above the probable use-voltage of 5 V to accelerate this test.

Table 6 compares the high temperature reliability of the MISFETs fabricated with layered ONO dielectrics with those having thermal and deposited silicon dioxide. The ONO MOSFETs have a significantly better high temperature lifetime, e.g., more than a factor of 100× better. Additionally, a packaged MISFET operated successfully for 240 hours.

TABLE 6

Device lifetimes at 350° C. with a 15 V (3 MV/cm) gate bias

| Insulator | Lifetime |
|---|---|
| Dry Thermal Oxide | 0.08 hour |
| Deposited Oxide | 0.75 hour |
| ONO | >75 hours |
| ONO (Packaged, Estimated 335° C.) | 240 hours |

The ONO sample was wafer tested at 350° C. for 75 hours without failing. At that point, it was decided to package devices for testing, because the device metals would oxidize if exposed to air for several days at 350° C. The packaged parts were then tested at 350° C. The exact temperature of the packaged devices could not be easily controlled, however, and thus the estimated testing temperature was probably closer to 335° C. than to 350° C. Nevertheless, the ONO sample survived for 10 days (240 hours) at 335° C.

Figure 9:
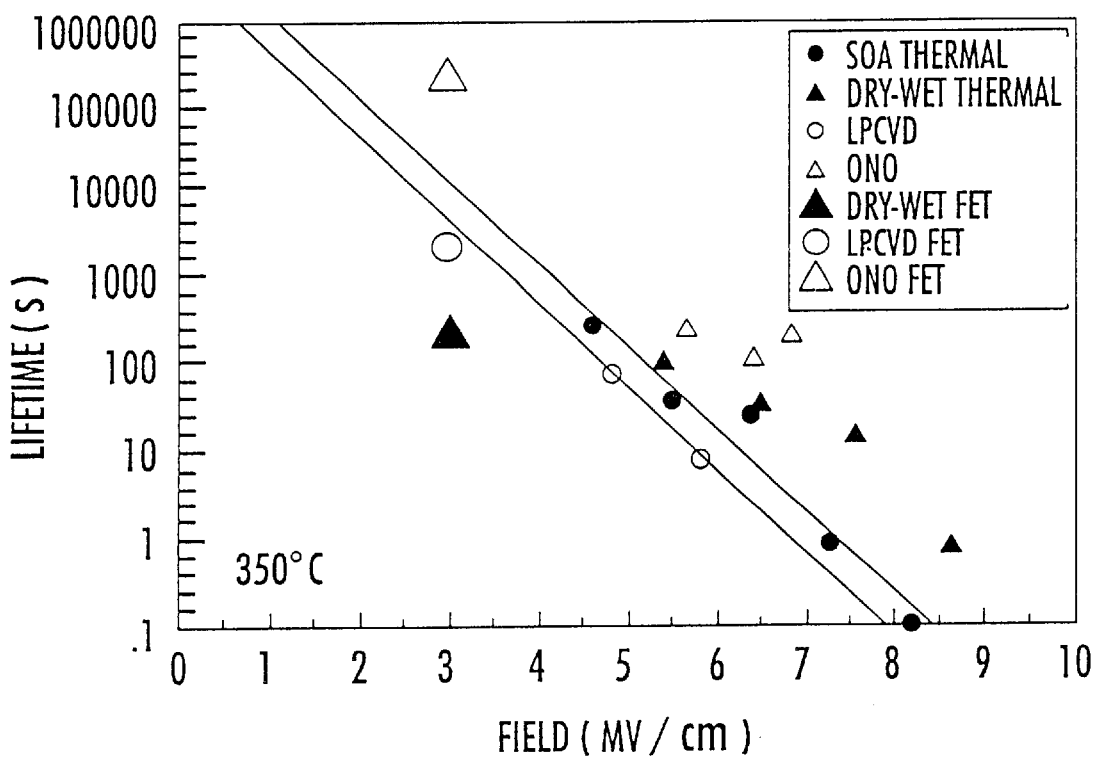
FIG. 9 is a plot of MISFET lifetimes according to the present invention.

FIG. 9 also shows the MISFET lifetimes for comparison with the capacitor results. The MISFETs with the dry-wet thermal oxide have a dramatically reduced lifetime when compared with the capacitors. This is most likely due to the physical steps created at the source and drain regions by the accelerated growth of the implanted regions. The deposited oxide MISFET failed very close to its projected time, but slightly lower. The ONO MISFET fails almost exactly where one would predict from the MIS capacitor data.

Diodes

Figure 6:
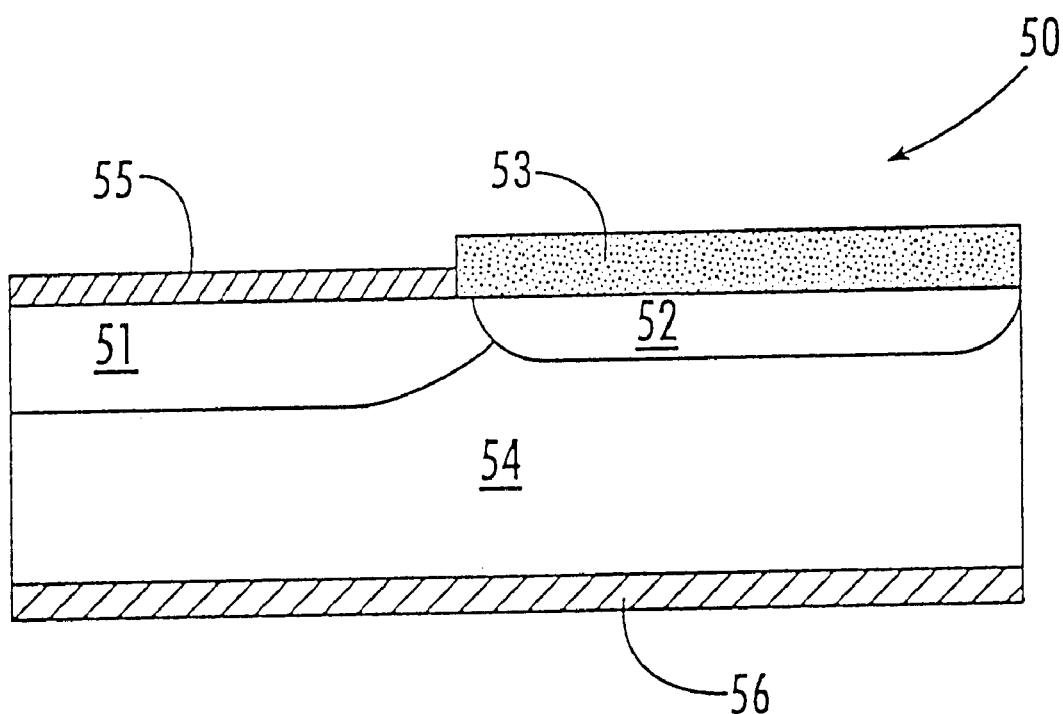
FIG. 6 is a cross-sectional view of a planar diode passivated according to the present invention.

In addition to the MIS capacitors, a 4-wafer lot of planar diodes was fabricated. A cross section of an exemplary device 50 is shown in FIG. 6. The top p-layer 51 was implanted with variable doses. A second implant, the Junction Termination Extension (JTE) 52, was performed adjacent to the first implant to reduce field crowding. Although the JTE implant helps reduce the field crowding at the edge of the device, a high quality dielectric 53 on the surface of the wafer is required for passivation. The shape of the planar diode was circular. The dielectric 53 is formed of the oxide/nitride/oxide according to the present invention. Specifically, all three layers were deposited by PECVD.

The fabrication was repeated for comparison purposes with PECVD Si$_3$N$_4$ and PECVD SiO$_2$ as single layer insulators.

The mask set used for this device consisted of diodes with radii varying from 100 to 500 $\mu$m, while the width of the JTE implant varied between 50 and 150 $\mu$m. The epitaxial layers should support 5 kV, but the JTE of these devices were designed to block only 3 kV in order to place more stress on the passivation. The device performance is more sensitive to the passivation, because the JTE implants do not terminate all of the fields generated by the higher voltage. Accordingly, the passivation must withstand much larger fields. Thus, the devices were deliberately designed to help evaluate the various dielectric materials.

Five wafers were procured for the fabrication of high voltage P-i-N diodes. 4H n-type substrates for these devices had a 50 $\mu$m epitaxial n$^-$layer doped about 1×10$^{15}$ cm$^{-3}$ grown, and a 1.2 $\mu$m p$^-$ layer doped 1×10$_{18}$ cm$^{-3}$.

FIG. 6 also illustrates the n-type portion of the device at 54, the anode at 55, and the cathode at 56.

The fabrication of the diode began with etching alignment marks into the SiC wafer for alignment of the future masks. The anode junction was defined by etching through the top p-type layer in most of the surface, while leaving circular p-type anode regions exposed. Using a thick (1.4 $\mu$m) oxide mask, the regions receiving the low-dose JTE implant were defined. The thickness of the oxide mask and the implantation energy and dosage of the p-type dopant (aluminum) were chosen so that only the intended termination region receives the implant while it is blocked entirely from regions where it is not intended. The junction region also received this implantation step so that a high surface doping of the p-type layer was formed for ohmic anode contacts. The implanted aluminum was annealed to minimize the damage from ion implantation and to electrically activate the implants.

The breakdown voltage was measured on each type of diode. The silicon nitride had a great deal of leakage, and broke down at 2.6 kV. The oxide devices had low/no leakage and broke down around 3.5 kV. The devices incorporating the dielectric structure of the invention had no leakage out to 5 kV, and broke at a world-record level of 5.9 kV.

In summary, the ONO dielectric of the present invention provides a significant improvement. The high temperature lifetime of the ONO layered MISFET is more than a factor of 100× better than the state-of-the-art deposited oxide. This has immediate relevance to high temperature SiC power devices and circuits. By projecting back to the likely rated operating field of 1 MV/cm, it can be predicted that ONO MOSFETs will have a lifetime of more than 240,000 hours at 335° C.

Thus, the success demonstrated to date on these several devices indicates that the passivation of the present invention will be expected to work well on almost all passivation or insulated gate structures.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A dielectric structure for silicon carbide semiconductor devices, said dielectric structure formed on a portion of silicon carbide and comprising:
   a first layer of silicon dioxide on said silicon carbide portion and having a thickness representing between about 0.5 and 33 percent of the thickness of said dielectric structure;
   a layer of silicon nitride on said first silicon dioxide layer; and
   a second layer of silicon dioxide on said silicon nitride layer and having a thickness representing between about 0.5 and 33 percent of the thickness of said dielectric structure; and
   said layer of silicon nitride making up the remainder of the thickness of said dielectric structure.

2. A dielectric structure according to claim 1 and further comprising a gate contact on said second layer of silicon dioxide.

3. A dielectric structure according to claim 1 wherein said second silicon dioxide layer is between about 50 and 100 angstroms thick.

4. A dielectric structure according to claim 1 wherein said silicon carbide portion comprises a substrate.

5. A dielectric structure according to claim 1 wherein said silicon carbide portion comprises an epitaxial layer.

6. A dielectric structure according to claim 1 wherein said silicon carbide portion comprises an implanted region.

7. A dielectric structure according to claim 1 wherein said silicon carbide has a polytype selected from the group consisting of the 3C, 4H, 6H and 15R polytypes of silicon carbide.

8. A dielectric structure according to claim 1 wherein said dielectric structure forms the gate insulator of an MIS gated device.

9. A dielectric structure according to claim 1 wherein said dielectric structure forms passivation portions of a power device.

10. A dielectric structure according to claim 9 wherein said passivation portions are edge termination portions.

11. A dielectric structure according to claim 1 wherein said dielectric structure forms the field insulator portions of an integrated circuit.

12. A dielectric structure according to claim 1 wherein said silicon carbide portion comprises a single crystal substrate.

13. A dielectric structure according to claim 1 wherein said silicon carbide portion comprises an epitaxial layer of silicon carbide.

14. A dielectric structure according to claim 1 wherein said silicon carbide portion comprises an implanted region of silicon carbide.

15. A semiconductor device comprising a passivation portion that includes the dielectric structure according to claim 1.

16. A semiconductor device comprising a field insulator that includes the dielectric structure according to claim 1.

17. A dielectric structure for the passivation portions of silicon carbide power semiconductor devices, said dielectric structure formed on a portion of silicon carbide and comprising:
   a first layer of silicon dioxide on said silicon carbide portion;
   a layer of silicon nitride on said silicon dioxide layer; and
   a second layer of silicon dioxide on said silicon nitride layer;
   wherein said passivation portions are edge termination portions.

18. A dielectric structure according to claim 17 wherein said silicon carbide portion comprises a single crystal substrate.

19. A dielectric structure according to claim 17 wherein said silicon carbide portion comprises an epitaxial layer of silicon carbide.

20. A dielectric structure according to claim 17 wherein said silicon carbide portion comprises an implanted region of silicon carbide.

* * * * *